(12) United States Patent
Hwang et al.

(10) Patent No.: US 10,290,683 B2
(45) Date of Patent: May 14, 2019

(54) ORGANIC LIGHT EMITTING DISPLAY DEVICE

(71) Applicant: LG DISPLAY CO., LTD., Seoul (KR)

(72) Inventors: Yea Jin Hwang, Paju-si (KR); Juhn Suk Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 15 days.

(21) Appl. No.: 15/534,426

(22) PCT Filed: Oct. 6, 2015

(86) PCT No.: PCT/KR2015/010551
§ 371 (c)(1),
(2) Date: Jun. 8, 2017

(87) PCT Pub. No.: WO2016/093479
PCT Pub. Date: Jun. 16, 2016

(65) Prior Publication Data
US 2018/0261654 A1 Sep. 13, 2018

(30) Foreign Application Priority Data
Dec. 10, 2014 (KR) ........................ 10-2014-0177777

(51) Int. Cl.
*H01L 29/08* (2006.01)
*H01L 27/32* (2006.01)
*G09G 3/3225* (2016.01)
*H01L 51/50* (2006.01)

(52) U.S. Cl.
CPC ....... *H01L 27/3218* (2013.01); *G09G 3/3225* (2013.01); *H01L 27/3216* (2013.01); *H01L 51/5036* (2013.01); *G09G 2300/0452* (2013.01)

(58) Field of Classification Search
CPC .................................................. H01L 27/3218
USPC .......................................................... 257/40
See application file for complete search history.

(56) References Cited

U.S. PATENT DOCUMENTS

| 6,366,025 B1 | 4/2002 | Yamada |
| 2008/0165257 A1* | 7/2008 | Boettiger .......... H01L 27/14603 348/222.1 |
| 2009/0302331 A1 | 12/2009 | Smith et al. |
| 2013/0002118 A1 | 1/2013 | Ko |

(Continued)

FOREIGN PATENT DOCUMENTS

| KR | 2001-0014509 A | 2/2001 |
| KR | 10-2008-0111130 A | 12/2008 |

(Continued)

*Primary Examiner* — Ajay Arora
(74) *Attorney, Agent, or Firm* — Seed IP Law Group LLP (57) ABSTRACT

Disclosed is an organic light emitting display device including a plurality of unit pixels. The unit pixels includes one or more red sub-pixels, one or more green sub-pixels, and one or more blue sub-pixels, the blue sub-pixels included in adjacent pixels in a first direction are located on the same line, two columns of the red sub-pixels and the green sub-pixels are disposed between columns formed by the blue sub-pixels in the first direction, the blue sub-pixels have a quadrangular shape and one of diagonal lines of the quadrangle shape is disposed to be parallel to the first direction, and the red sub-pixels and the green sub-pixels have a triangular shape and are disposed to be spaced apart from two adjacent sides of the quadrangular shape by a predetermined distance.

17 Claims, 7 Drawing Sheets

(56) References Cited

U.S. PATENT DOCUMENTS

2013/0113363 A1   5/2013  Hong
2014/0319479 A1*  10/2014 Park ..................... H01L 51/525
                                                257/40
2015/0212367 A1*  7/2015  Wang ................ G02F 1/133514
                                                349/108

FOREIGN PATENT DOCUMENTS

KR   10-2013-0007309 A   1/2013
KR   10-2013-0049023 A   5/2013
KR   10-2014-0119253 A   10/2014

* cited by examiner

ORGANIC LIGHT EMITTING DISPLAY DEVICE

BACKGROUND

Field

The present disclosure relates to an organic light emitting display device and a structure thereof.

Description of the Related Art

In accordance with development of information society, there are various types of increasing demands for display devices for displaying images. In recent years, various display devices such as a liquid crystal display (LCD), a plasma display, and an organic light emitting display (OLED) are being utilized.

Generally, a thin film transistor substrate for a display device includes a plurality of unit pixels having a quadrangular structure which is disposed in a matrix. One unit pixel includes three sub-pixels including a red sub-pixel R, a green sub-pixel G, and a blue sub-pixel B each having a rectangular shape. That is, it is considered that the unit pixel has a structure in which a plurality of sub-pixels is disposed in a matrix.

Even though a high density pixel integration degree of several hundred ppi (pixel per inch) level has been implemented with a rectangular sub-pixel structure as described above, there is a limitation that an ultra-high density pixel integration degree of a thousand ppi level cannot be implemented.

SUMMARY

An object of the present disclosure is to provide an organic light emitting display device. More specifically, another object of the present disclosure is to provide a structure of a pixel and a sub-pixel with an improved integration degree. Further, still another object of the present disclosure is to provide an organic light emitting display device with a more efficient pixel structure.

According to an aspect of the present disclosure, there is provided an organic light emitting display device including a plurality of unit pixels. The unit pixels may include one or more red sub-pixels, one or more green sub-pixels, and one or more blue sub-pixels, the blue sub-pixels included in adjacent pixels in a first direction may be located on the same line, two columns of the red sub-pixels and the green sub-pixels may be disposed between columns formed by the blue sub-pixels in the first direction, the blue sub-pixels may have a quadrangular shape and one of diagonal lines of the quadrangle shape may be disposed to be parallel to the first direction, and the red sub-pixels and the green sub-pixels may have a triangular shape and may be disposed to be spaced apart from two adjacent sides of the quadrangular shape by a predetermined distance.

According to another aspect of the present disclosure, there is provided an organic light emitting display device including a plurality of unit pixels. The unit pixels may include one or more red sub-pixels, one or more green sub-pixels, and one or more blue sub-pixels, the blue sub-pixels included in adjacent pixels in a first direction may be located on the same line, one column of the red sub-pixels and one column of the green sub-pixels may be disposed between both sides of a column formed by the blue sub-pixels in the first direction, the blue sub-pixel, the red sub-pixel, and the green sub-pixel may have a quadrangular shape and one of diagonal lines of the quadrangular shape may be parallel to the first direction, and the red sub-pixels and the green sub-pixels may be disposed to be spaced apart from two adjacent sides of the quadrangular shape formed by the blue sub-pixels by a predetermined distance.

According to an exemplary embodiment of the present disclosure, a structure of a pixel and a sub-pixel with an improved integration degree and improved resolution as compared with the related art may be formed. Specifically, the pixel structure according to an exemplary embodiment of the present disclosure is effective to increase aperture so that a life span of the display device may be increased.

BRIEF DESCRIPTION OF DRAWINGS

The above and other aspects, features and other advantages of the present disclosure will be more clearly understood from the following detailed description taken in conjunction with the accompanying drawings, in which:

FIG. 3(*a*) is a plan view illustrating a pixel structure according to a first exemplary embodiment of the present disclosure;

FIG. 3(*b*) is a plan view illustrating a modification embodiment of the first exemplary embodiment;

DETAILED DESCRIPTION

In describing components of the exemplary embodiments of the present disclosure, terminologies such as first, second, A, B, (a), (b), and the like may be used. Such terms are used to distinguish a component from another component but a nature, an order, or the number of the components is not limited by the terminology. If it is described that a component is "connected" or "coupled" to another component, it is understood that the component may be directly connected or coupled to the other component, but another component may be "interposed" between the components or the components may be "connected" or "coupled" by another component. When an element or layer is disposed "on" other element or layer, another layer or another element may be interposed directly on the other element or therebetween. A size and a thickness of each component illustrated in the drawing are illustrated for convenience of description, and the present disclosure is not limited to the size and the thickness of the component illustrated.

An "organic light emitting display device" which is also referred to as a "display device" in this disclosure is used as a generic term for an organic light emitting diode panel and a display device which employs the organic light emitting diode panel. Generally, two different types of organic light emitting display devices include a white organic light emitting type and an RGB organic light emitting type. In the white organic light emitting type, sub-pixels of a pixel are configured to emit white light and a set of color filters is used to filter white light to generate red light, green light, and blue light from the corresponding sub-pixels. Further, the white organic light emitting type may include a sub-pixel configured without having a color filter to form a sub-pixel for generating white light. In the RGB organic light emitting type, an organic light emitting layer in each sub-pixel is configured to emit a designated color of light. For example, one pixel includes a red sub-pixel having an organic light emitting layer which emits red light, a green sub-pixel having an organic light emitting layer which emits green light, and a blue sub-pixel having an organic light emitting layer which emits blue light.

The features of various embodiments of the present disclosure can be partially or entirely bonded to or combined with each other and can be interlocked and operated in technically various ways by those skilled in the art, and the embodiments can be carried out independently of or in association with each other.

Hereinafter, various exemplary embodiments of the present disclosure will be described in detail with reference to accompanying drawings.

Figure 1:
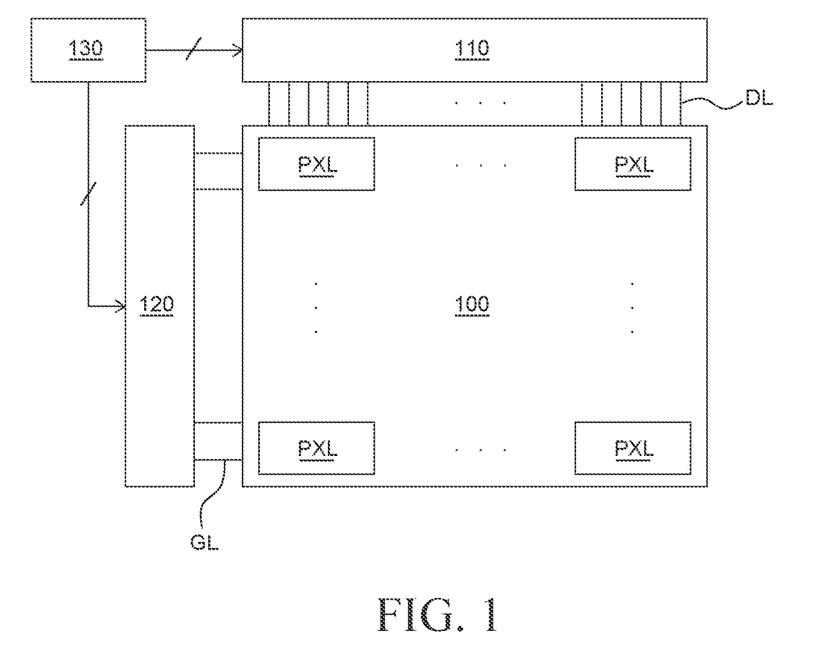
FIG. 1 is a block diagram illustrating an organic light emitting display device according to an exemplary embodiment of the present disclosure.

FIG. 1 is a block diagram conceptually illustrating an organic light emitting display device according to an exemplary embodiment of the present disclosure.

Referring to FIG. 1, a display device according to an exemplary embodiment of the present disclosure includes a display panel 100, a data driving circuit 110, a gate driving circuit 120, and a timing controller 130.

The display panel 100 may be implemented by an organic light emitting diode panel. However, the display panel 100 to which the present disclosure is applied may also be implemented by a liquid crystal display panel, a plasma display panel, or an electrophoretic display panel.

In the display panel 100, a plurality of unit pixels PXL is formed. One unit pixel includes three sub-pixels (red, green, and blue sub-pixels).

The red sub-pixel includes a red OLED having a red light emitting layer, the green sub-pixel includes a green OLED having a green light emitting layer, and the blue sub-pixel includes a blue OLED having a blue light emitting layer. The OLED further includes a first electrode (for example, a cathode) laminated above the light emitting layer and a second electrode (for example, an anode) laminated below the light emitting layer and emits light by a top emission method. The light emitting layer emits light by a driving current which is applied from a thin film transistor (TFT) array via the second electrode.

The data driving circuit 110 includes a plurality of source drive ICs (source integrated circuits) to drive data lines DL of the display panel 100. The data driving circuit 110 converts input digital video data into a data voltage under the control of a timing controller 130 to supply the converted data voltage to the data lines DL. The data voltage is applied to the TFT array through the data lines DL to determine a driving current which is supplied from a driving element to the second electrode. Such a data driving circuit may be connected to a bonding pad of the display panel by a tape automated bonding (TAB) process or a chip on glass (COG) process or may be directly formed on the display panel. Further, in some cases, the data driving circuit may be formed to be integrated with the display panel.

The gate driving circuit 120 includes one or more gate drive ICs to sequentially supply a scan pulse (or a gate pulse) to gate lines GL of the display panel 100. A gate in panel (GIP) type gate driving circuit 120 may include a shift register formed on the display panel 100. Such a gate driving circuit may be connected to a bonding pad of the display panel by a tape automated bonding (TAB) process or a chip on glass (COG) process or may be implemented to be a gate in panel (GIP) type to be directly formed on the display panel. Further, in some cases, the gate driving circuit may be formed to be integrated with the display panel.

The timing controller 130 receives a plurality of timing signals from an external system to generate control signals to control an operation timing of the data driving circuit 110 and the gate driving circuit 120. The timing controller 130 receives digital video data from the system to supply the digital video data to the data driving circuit 110.

Figure 2:
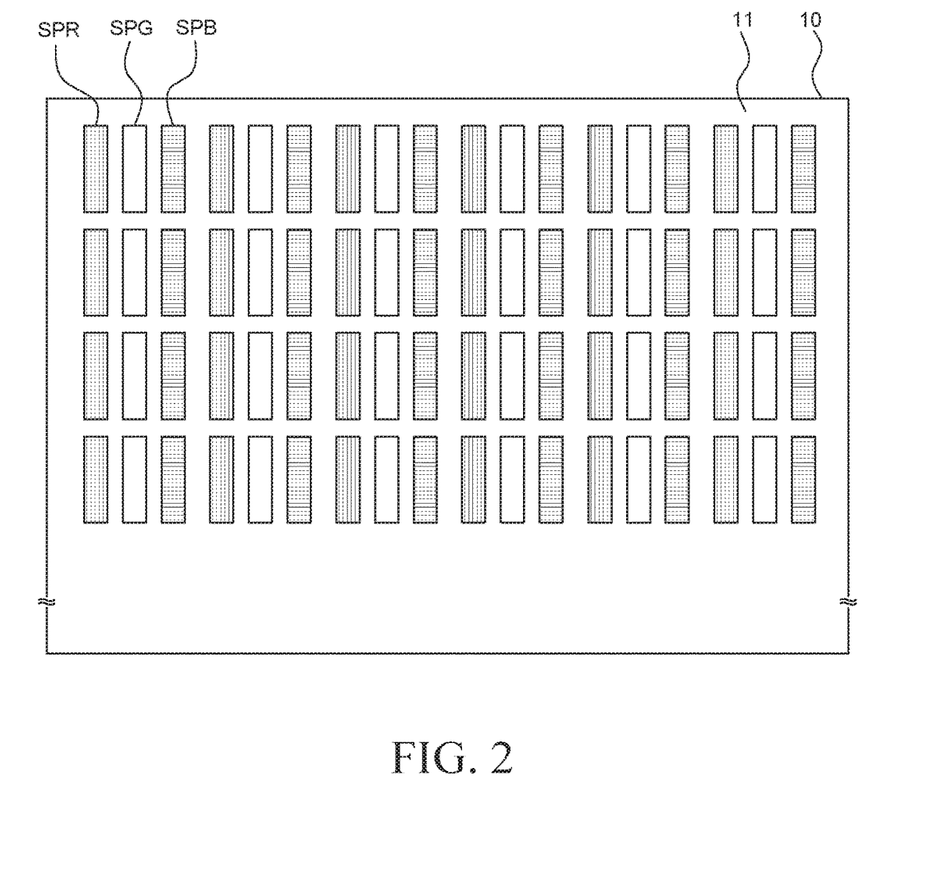
FIG. 2 is a plan view illustrating an RGB stripe type sub-pixel arrangement structure.

FIG. 2 is a view illustrating an RGB stripe type sub-pixel arrangement structure.

Referring to FIG. 2, each of unit pixels formed in the display panel 10 includes a red sub-pixel SPR, a green sub-pixel SPG, and a blue sub-pixel (SPB) which are adjacent to each other in parallel. The red, green, and blue sub-pixels SPR, SPG, and SPB are disposed in a stripe form and are partitioned by a black area 11. In OLEDS of the red, green, and blue sub-pixels SPR, SPG, and SPB, a red light emitting layer, a green light emitting layer, and a blue light emitting layer are formed, respectively. The light emitting layers may be deposited for every sub-pixel by means of a fine metal mask (FMM) process using a shadow mask.

The FMM process requests a process margin of a predetermined interval between adjacent red, green and blue sub-pixels SPR, SPG, and SPB. As a resolution of the display panel is increased, the interval between sub-pixels is reduced. Therefore, in order to secure the process margin, an aperture area of the sub-pixels needs to be reduced. When the aperture area is reduced, an aperture ratio and brightness of the entire panel is inevitably lowered. Therefore, since the RGB stripe structure has a limitation in high-resolution application, a new sub-pixel arrangement structure is required.

Figure 3:
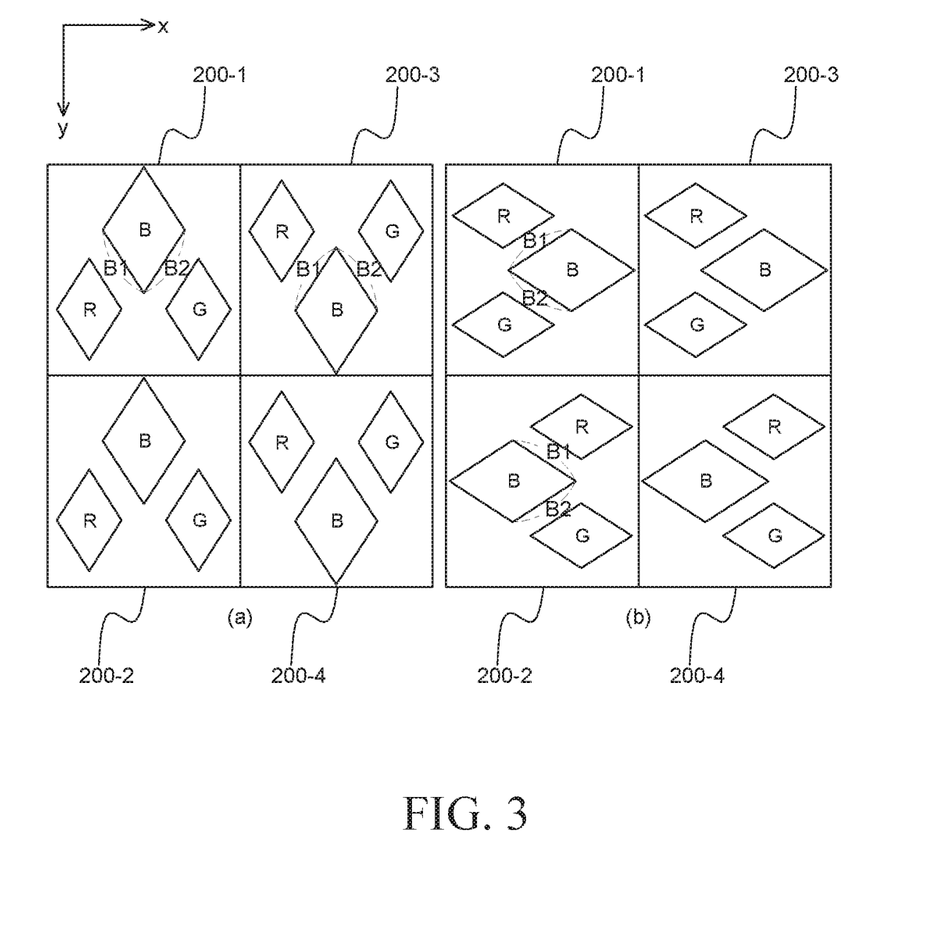

FIG. 3 is a view illustrating a pixel structure according to a first exemplary embodiment of the present disclosure.

An organic light emitting display device according to the first exemplary embodiment of the present disclosure includes a pixel having a structure which will be described below. The pixel structure which will be described below is a real structure in which one unit pixel 200-1 to 200-4 includes all R/G/B sub-pixels, but is not a structure in which one or more sub-pixels are shared by adjacent pixels.

FIG. 3(a) is a plan view illustrating a pixel structure according to the first exemplary embodiment of the present disclosure and FIG. 3(b) is a modification embodiment of the first exemplary embodiment.

The unit pixels 200-1 to 200-4 include one or more red sub-pixels R, one or more green sub-pixels G, and one or more blue sub-pixels B. Hereinafter, for the convenience of description, it is assumed that the unit pixel includes one red sub-pixel R, one green sub-pixel G, and one blue sub-pixel.

In this case, all the blue, red, and green sub-pixels may be formed as a quadrangle. Specifically, the blue, red, and green sub-pixels may be formed to have a rhombus shape (a diamond shape) in which a diagonal line is disposed in a first direction (y direction), as illustrated in FIG. 3(a). In the meantime, the red sub-pixel and the green sub-pixel are disposed above or below the blue sub-pixel in the unit pixel. In other words, the red sub-pixel and the green sub-pixel are disposed to be spaced apart from two adjacent sides (for example, in FIG. 3(a), two adjacent sides B1 and B2 which form a shape of V or Λ and in FIG. 3(b), two adjacent sides B1 and B2 which form a shape of <or>) of the quadrangle formed by the blue sub-pixels by a predetermined distance, respectively. The shorter the spaced distance, the smaller the unit pixel. Therefore, the pixel integration degree may be increased. Therefore, the spaced distance between the sub-pixels is adjusted in accordance with a desired resolution and a process margin.

A size of each sub-pixel is determined in consideration of a durability of an organic light emitting material used for each sub-pixel. For example, the sizes of sub-pixels may be determined in the descending order from the blue sub-pixel, the green sub-pixel, and the red sub-pixel. That is, the size of the blue sub-pixel is the largest. That is, the size of the sub-pixels may be allocated in the order of the blue, green, and red sub-pixels (blue>green>red).

Referring to FIG. 3(a), the blue sub-pixels B included in pixels 200-1 and 200-2 or 200-3 and 200-4 which are adjacent in the first direction (y direction) are located on the same line, and are aligned with one another along the same line. (see a-a' and d-d' of FIG. 5).

FIG. 3(b) is considered to be obtained by rotating FIG. 3(a) by 90 degrees. In this case, the blue sub-pixels B included in pixels (200-1 and 200-3 or 200-2 and 200-4) which are adjacent in an x direction are located on the same line, and are aligned with one another along the same line. (see 2-2' and 4-4' of FIG. 5).

First, an arrangement of sub-pixels will be described with reference to FIG. 3(a).

One red sub-pixel and one green sub-pixel are disposed on opposite sides of a column formed by the blue sub-pixel in the first direction (y direction). For example, red sub-pixels may be disposed on the left side of a column formed by the blue sub-pixel and green sub-pixels may be disposed on the right side of the column formed by the blue sub-pixel, or vice versa. The column formed by the blue sub-pixel in the first direction may be a straight line that extends through vertices of the blue sub-pixels in the column.

When the red sub-pixels and the green sub-pixels are disposed as illustrated in FIG. 3(a), the arrangement is the same as an extending direction of the data line. Therefore, a data line corresponding to a sub-pixel of a specific color does not pass a sub-pixel area of other color. Therefore, coupling between R and G, G and B, or B and R is not generated.

It is also considered that the red sub-pixels and the green sub-pixels may also be disposed between columns formed by the blue sub-pixels in the first direction in two columns. That is, when it is assumed that a column formed by the blue sub-pixels of the pixel 200-1 and the pixel 200-2 is a first column and a column formed by the blue sub-pixels of the pixel 200-3 and the pixel 200-4 is a second column, one green sub-pixel column and one red sub-pixel column are located between the first column and the second column. The green sub-pixel column and the red sub-pixel column may be straight lines that extend through vertices of the green subpixels and the red sub-pixels, respectively. In the meantime, the green sub-pixel may be disposed on one column between the two blue sub-pixel columns and the red sub-pixel may be disposed on the other column between the two blue sub-pixel columns. In this case, even though the red sub-pixel or the green sub-pixel are located on the same line in the first direction (y direction), the red sub-pixel or the green sub-pixel is not located on the same line in the second direction (x direction).

When the blue, red, and green sub-pixels are disposed as illustrated in FIG. 3(a), the blue-red-green sub-pixels are repeated on the same line in the second direction (x direction) perpendicular to the first direction (y direction) in accordance with a predetermined order (for example, R-G-B-R-G-B- . . . ).

Next, an arrangement of sub-pixels will be described with reference to FIG. 3(b).

One row of red sub-pixels and one row of green sub-pixels are disposed on opposite sides of a row formed by the blue sub-pixels in the second direction (x direction). For example, red sub-pixels may be disposed above a row formed by the blue sub-pixels and green sub-pixels may be disposed below the row formed by the blue sub-pixels, or vice versa.

When it is assumed that a row formed by the blue sub-pixels of the pixel 200-1 and the pixel 200-3 is a first row and a row formed by the blue sub-pixels of the pixel 200-2 and the pixel 200-4 is a second row, one green sub-pixel row and one red sub-pixel row are located between the first row and the second row. In the meantime, the green sub-pixels may be disposed on one row between the first and second rows and the red sub-pixels may be disposed on the other row between the first and second rows. In this case, even though the red sub-pixel or the green sub-pixel are located on the same line in the second direction (x direction), the red sub-pixel or the green sub-pixel are not located on the same line in the first direction (y direction).

When the blue, red, and green sub-pixels are disposed as illustrated in FIG. 3(b), the blue-red-green sub-pixels are repeated on the same line in the first direction (y direction) perpendicular to the second direction (x direction) in accordance with a predetermined order (for example, R-G-B-R-G-B- . . . ).

In the first exemplary embodiment, sub-pixels of any one color (for example, blue) may be formed on a substrate using a common layer structure. In the meantime, sub-pixels of the remaining two colors (for example, red and green) may be formed on the substrate using a slot mask. That is, after depositing a blue organic light emitting material on the entire substrate, red and green organic light emitting materials may be deposited in a predetermined position through a mask. In this case, a vertical alignment margin d and a horizontal alignment margin e of the blue sub-pixel are minimized, so that it is advantageous to implement high resolution.

Figure 4:
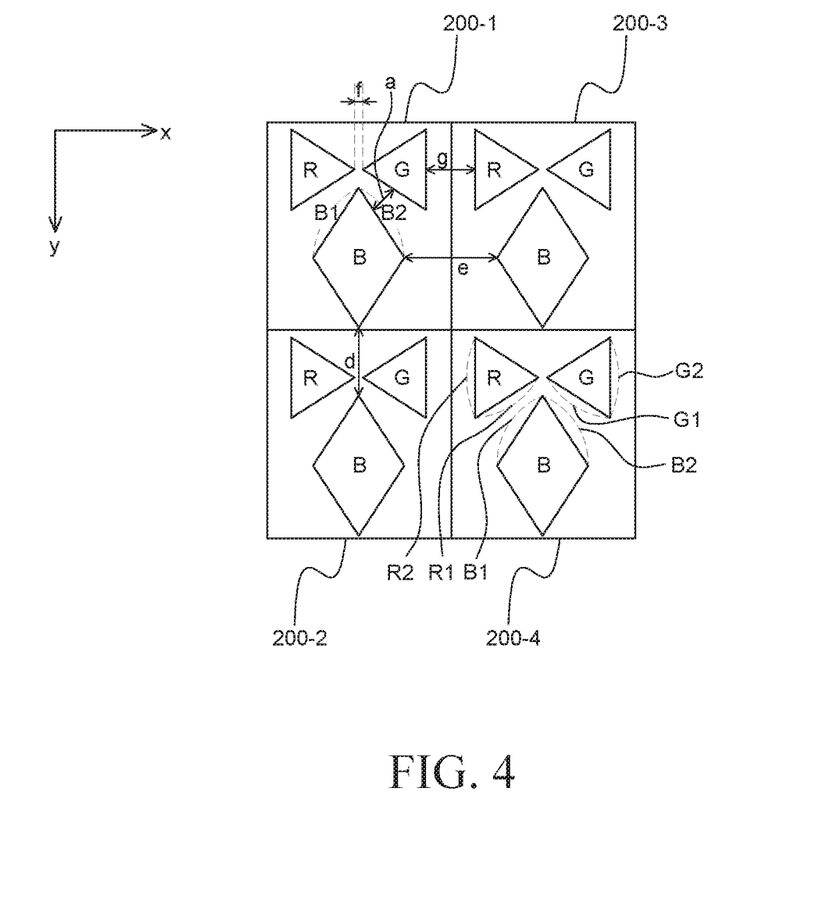
FIG. 4 is a plan view illustrating a pixel structure according to a second exemplary embodiment of the present disclosure.
Figure 5:
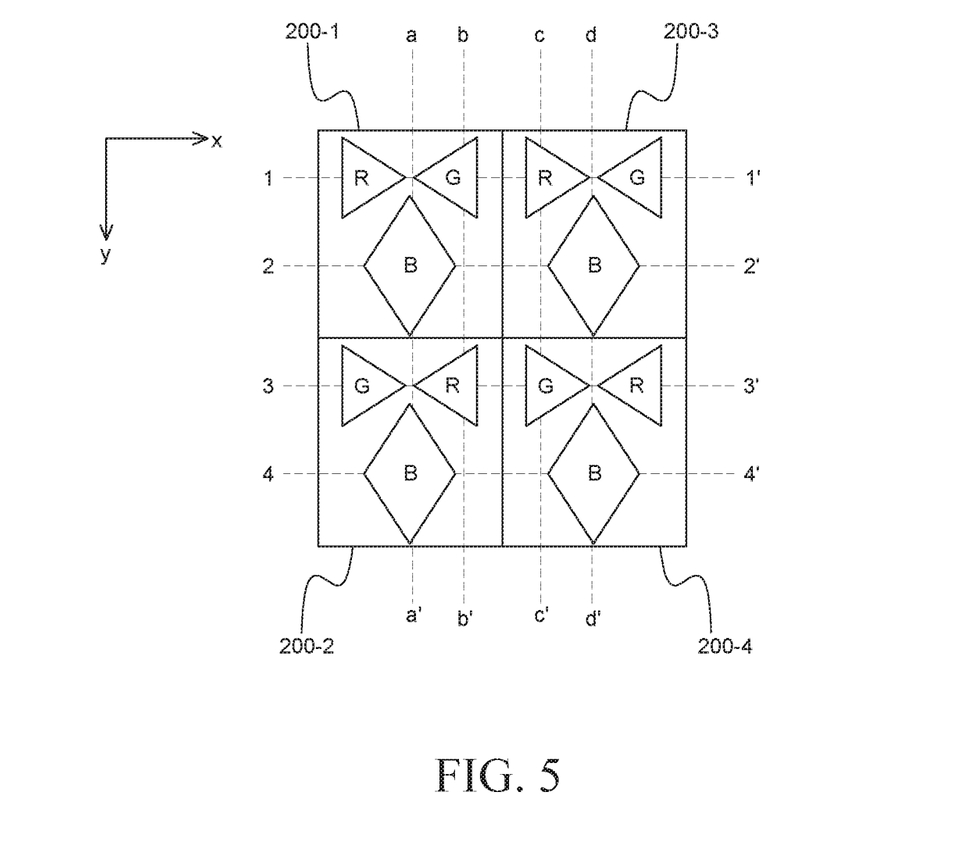
FIG. 5 is a plan view illustrating a modification embodiment of the second exemplary embodiment.

FIG. 4 is a view illustrating a pixel structure according to a second exemplary embodiment of the present disclosure. Further, FIG. 5 is view illustrating a modification embodiment of the second exemplary embodiment.

A second exemplary embodiment is a structure which may increase a pixel integration degree and resolution more than that of the first exemplary embodiment. In other words, the second exemplary embodiment is a structure which may reduce a distance spaced between sub-pixels. To this end, the red and green sub-pixels have a triangular shape. A pixel structure which will be described below is a real structure in which one unit pixel 200-1 to 200-4 includes all R/G/B sub-pixels. Each unit pixel 200-1 to 200-4 includes one or more red sub-pixels R, one or more green sub-pixels G, and one or more blue sub-pixels B. Hereinafter, for the convenience of description, it is assumed that the unit pixel includes one red sub-pixel R, one green sub-pixel G, and one blue sub-pixel B.

In this case, the blue sub-pixels may be formed to have a rhombus shape (a diamond shape) in which a diagonal lines are disposed in a first direction (y direction) as illustrated in FIG. 4. The red sub-pixel and the green sub-pixel may be formed to have a triangular shape. In this case, the red sub-pixel may have a triangular shape having a side R1 which faces a first side B1 of the quadrangle and a side R2 which is parallel to the first direction. Further, the green sub-pixel may have a triangular shape having a side G1 which faces a second side B2 adjacent to the first side B1 and a side G2 which is parallel to the first direction. When the side R2 of the red sub-pixel which is parallel to the first direction faces the side G2 of the red sub-pixel which is parallel to the first direction, it is advantageous to reduce the distance spaced between the sub-pixels. The side R1 and the side B1 and/or the side G1 and the side B2 may be parallel to each other. However, it is obvious that the shapes of the blue, red, and green sub-pixels may be modified in accordance with a display characteristic or an element characteristic. That is, the red or the green sub-pixel has a rhombus shape and the remaining two color sub-pixels may have a triangular shape.

In the meantime, the red sub-pixel and the green sub-pixel are disposed above or below the blue sub-pixel in the unit pixel. In FIG. 4, the red sub-pixel and the green sub-pixel are disposed above the blue sub-pixel. However, when FIG. 4 rotates by 180 degrees, it is considered that the red sub-pixel and the green sub-pixel are disposed below the blue sub-pixel.

The red sub-pixel and the green sub-pixel are disposed to be spaced apart from the adjacent two sides B1 and B2 of the quadrangle formed by the blue sub-pixel by a predetermined distance a, respectively. The shorter the spaced distance, the smaller the unit pixel. Therefore, the pixel integration degree may be increased. In the pixel according to the exemplary embodiment of the present disclosure, the red sub-pixel and the green sub-pixel are disposed such that their vertexes face each other. Therefore, the spaced distance f between two sub-pixels may be reduced. That is, when two sub-pixels are adjacent to each other at points, rather than lines, even though color mixture is generated in both sub-pixels, the color mixture may not be visible. Therefore, the color mixture problem between sub-pixels is not remarkably revealed through the above-described arrangement, so that it is possible to increase the FMM margin. When the FMM margin is increased, defect is reduced during the pixel alignment process. Further, when the FMM margin is larger, a pixel size may be increased. Therefore, the aperture rate is increased, which results in reducing a load of the organic light emitting element to obtain the same brightness. As a result, a life span of the organic light emitting display device is also increased.

The spaced distance a between the blue sub-pixel and the green (or red) sub-pixel may be designed to be smaller than f. Further, the alignment margin f between sub-pixels having a triangular shape may be designed to be smaller than a spaced distance g between sub-pixels included in the adjacent pixel.

An area of each sub-pixel is determined in consideration of a durability of an organic light emitting material used for each sub-pixel. For example, the sizes of sub-pixels may be determined in the descending order from the blue sub-pixel, the green sub-pixel, and the red sub-pixel. That is, the size of the blue sub-pixel is the largest. That is, the sizes of the sub-pixels may be allocated in the order of the blue, green, and red sub-pixels (blue>green>red). However, the order of the sizes may be modified.

The blue sub-pixel may be formed on the substrate using a common layer structure. In the meantime, the remaining two color (for example, red and green) sub-pixels may be formed on the substrate using a slot mask. That is, after depositing a blue organic light emitting material on the entire substrate, red and green organic light emitting materials may be deposited in a predetermined position through a mask. In this case, a vertical alignment margin d and a horizontal alignment margin e of the blue sub-pixel are minimized, so that it is advantageous to implement high resolution.

The blue sub-pixels B included in pixels 200-1 and 200-2 or 200-3 and 200-4 which are adjacent in the first direction (y direction) are located on the same line. (see a-a' and d-d' of FIG. 5). Further, the blue sub-pixels B included in pixels 200-1 and 200-3 or 200-2 and 200-4 which are adjacent in the second direction (x direction) are located on the same line. (see 2-2' and 4-4' of FIG. 5).

The red sub-pixels and the green sub-pixels are disposed along the second direction (x direction) between a row formed by the blue sub-pixels in one row. (see 1-1' and 3-3' of FIG. 5). In this case, the red sub-pixels and the green sub-pixels are disposed to appear alternately one by one in the x direction as illustrated in FIGS. 4 and 5.

In the meantime, one column of red sub-pixels and one column of green sub-pixels are disposed on both sides of a column formed by the blue sub-pixels in the first direction (y direction). Therefore, it is considered that the red sub-pixels and the green sub-pixels are disposed between the columns formed by the blue sub-pixels in the first direction in two columns. (see b-b' and c-c' of FIG. 5).

A first direction arrangement of the red and green sub-pixels will be described with reference to FIG. 4. As illustrated in FIG. 4, between two columns formed by the red sub-pixels and the green sub-pixels disposed between columns formed by the blue sub-pixels in the y direction, the red sub-pixels are disposed in the first column and the green sub-pixels are disposed in the second column, or vice versa. That is, between the columns formed by the blue sub-pixels in the y direction, one column (first column) formed by the red sub-pixels in the y direction and one column (second column) formed by the green sub-pixels in the y direction are located. In other words, on both sides of the columns formed by the blue sub-pixels in the y direction, one column (first column) formed by the red sub-pixels in the y direction and one column (second column) formed by the green sub-pixels in the y direction are located.

Since the y direction arrangement of the red sub-pixel and the green sub-pixel as illustrated in FIG. 4 is the same as an extending direction of the data line, the data line corresponding to a sub-pixel of a specific color (for example, R) does not pass a sub-pixel area of other color (for example, G). Therefore, coupling between R and G, G and B, or B and R is not generated so that color reproducibility is improved.

A first direction arrangement of the red and green sub-pixels will be described with reference to FIG. 5.

As illustrated in FIG. 5, in two columns (b-b' and c-c') formed by the red sub-pixels and the green sub-pixels disposed between columns (a-a' and d-d') formed by the blue sub-pixels in the y direction, the red sub-pixels and the green sub-pixels may be alternately disposed one by one. That is, between the columns formed by the blue sub-pixels in the y direction, two columns in which the red sub-pixels and the green sub-pixels alternately appear in the y direction are located. In this case, the red and green sub-pixels may be disposed such that the red sub-pixels and the green sub-pixels alternately appear between two columns (b-b' and c-c'). (1-1' and 3-3').

According to the x and y direction arrangement of the red sub-pixel and the green sub-pixel as illustrated in FIG. 5, since the red sub-pixels and the green sub-pixels are alternately disposed, adverse influence from an underlying layer may be dispersed.

Figure 6:
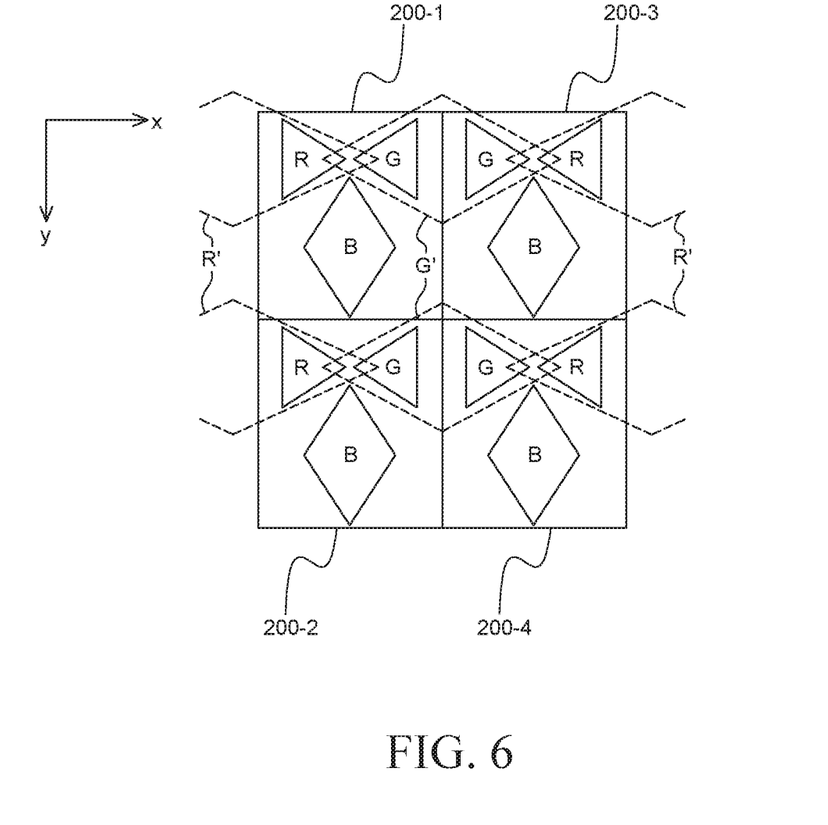
FIG. 6 is a plan view illustrating a pixel structure according to a third exemplary embodiment of the present disclosure.
Figure 7:
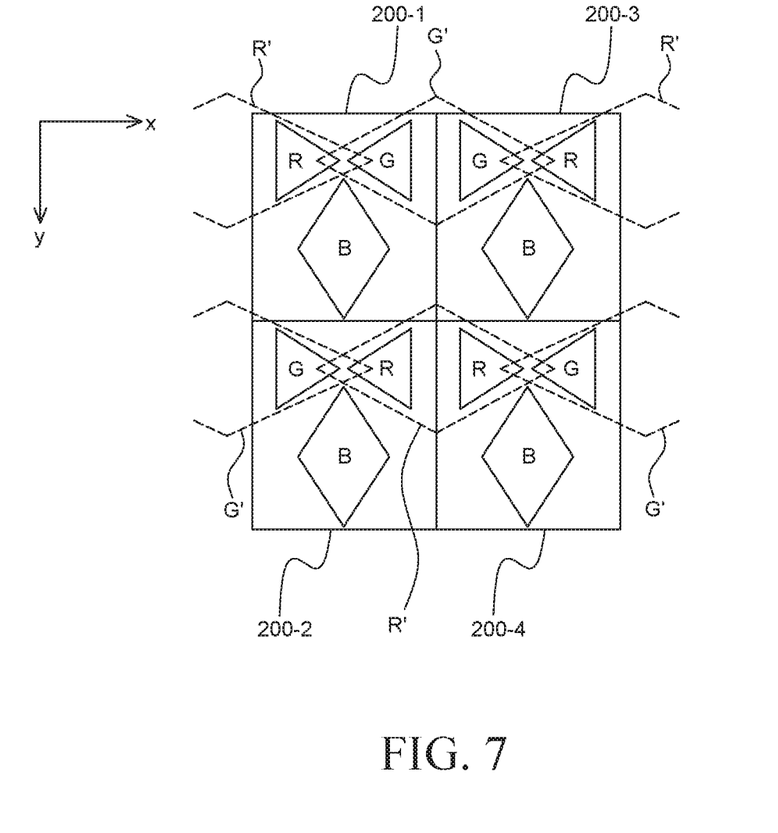
FIG. 7 is plan view illustrating a modification embodiment of the third exemplary embodiment.

FIG. 6 is a view illustrating a pixel structure according to a third exemplary embodiment of the present disclosure. Further, FIG. 7 is a modification embodiment of the third exemplary embodiment.

A third exemplary embodiment is a structure which may increase a pixel integration degree more than that of the first exemplary embodiment. A pixel structure which will be described below is a real structure in which one unit pixel 200-1 to 200-4 includes all R/G/B sub-pixels. Each unit pixel 200-1 to 200-4 includes one or more red sub-pixels R, one or more green sub-pixels G, and one or more blue sub-pixels B. Hereinafter, for the convenience of description, it is assumed that the unit pixel includes one red sub-pixel R, one green sub-pixel G, and one blue sub-pixel B.

The blue sub-pixel may be formed to have a rhombus shape (a diamond shape) in which diagonal lines are disposed in a first direction (y direction) as illustrated in FIG. 4. The red and green sub-pixels have a triangular shape. The arrangement of the blue, green, and green sub-pixels in the unit pixel is the same as described with reference to FIGS. 4 and 5.

Referring to FIG. 6, the blue sub-pixels B included in pixels 200-1 and 200-2 or 200-3 and 200-4 which are adjacent in the first direction (y direction) are located on the same line. (see a-a' and d-d' of FIG. 5). Further, the blue sub-pixels B included in pixels 200-1 and 200-3 or 200-2 and 200-4 which are adjacent in the second direction (x direction) are located on the same line. (see 2-2' and 4-4' of FIG. 5).

The red sub-pixels and the green sub-pixels are disposed along the second direction (x direction) between rows formed by the blue sub-pixels in one row. (see 1-1' and 3-3' of FIG. 5). In this case, the red sub-pixels and the green sub-pixels are disposed to appear alternately two by two in the x direction as illustrated in FIG. 6. That is, the red sub-pixels and the green sub-pixels may be continuously disposed between two pixels adjacent in the second direction (x direction), with the red sub-pixel being adjacent to a corresponding red sub-pixel in an adjacent pixel and the green sub-pixel being adjacent to a corresponding green sub-pixel in an adjacent pixel. In the third exemplary embodiment, since a slot mask having a larger slot size (R' and/or G') than the second exemplary embodiment is used, a more efficient process may be performed.

In the meantime, one column of red sub-pixels and one column of green sub-pixels are disposed on both sides of a column formed by the blue sub-pixels in the first direction (y direction). Therefore, it is also considered that the red sub-pixels and the green sub-pixels are disposed between columns formed by the blue sub-pixels in the first direction in two columns. (see b-b' and c-c' of FIG. 5).

An arrangement of the red sub-pixel and the green sub-pixel in the first direction will be described with reference to FIGS. 6 and 7.

First, as illustrated in FIG. 6, two columns of the red sub-pixels or the green sub-pixels may be disposed in two columns disposed between columns formed by the blue sub-pixels in the y direction. That is, the column of the red sub-pixels is located on one side (for example, left side) of the column formed by the blue sub-pixels in the y direction and the column of the green sub-pixels is located on the other side. Therefore, the blue/red/green sub-pixels may repeatedly appear in this manner <one column of blue sub-pixels-two columns of green sub-pixels-one columns of blue sub-pixels-two columns of red sub-pixels-one column of blue sub-pixels- . . . > in the y direction.

Since the y direction arrangement of the red sub-pixels and the green sub-pixels as illustrated in FIG. 4 is the same as an extending direction of the data line, the data line corresponding to a sub-pixel of a specific color (for example, R) does not pass a sub-pixel area of other color (for example, G). Therefore, coupling between R and G, G and B, or B and R is not generated so that color reproducibility is improved.

Next, as illustrated in FIG. 7, in two columns formed by the red sub-pixels and the green sub-pixels disposed between columns formed by the blue sub-pixels in the y direction, the red sub-pixels and the green sub-pixels may be alternately disposed in the y direction one by one. That is, between the columns formed by the blue sub-pixels in the y direction, two columns in which the red sub-pixels and the green sub-pixels alternately appear in the y direction are located. In this case, differently from FIG. 5, the same color sub-pixels appear in the x direction of two columns.

According to the x and y direction arrangement of the red sub-pixels and the green sub-pixels as illustrated in FIG. 7, since the red sub-pixels and the green sub-pixels are alternately disposed, adverse influence from an underlying layer may be dispersed.

The exemplary embodiments of the present disclosure can also be described as follows:

According to an aspect of the present disclosure, an organic light emitting display device includes a plurality of unit pixels. The unit pixels may include one or more red sub-pixels, one or more green sub-pixels, and one or more blue sub-pixels, the blue sub-pixels included in adjacent pixels in a first direction may be located on the same line, two columns of the red sub-pixels and the green sub-pixels may be disposed between columns formed by the blue sub-pixels in the first direction, the blue sub-pixels may have a quadrangular shape and one of diagonal lines of the quadrangle shape may be disposed to be parallel to the first direction, and the red sub-pixels and the green sub-pixels may have a triangular shape and may be disposed to be spaced apart from two adjacent sides of the quadrangular shape by a predetermined distance.

The red sub-pixels and the green sub-pixels may be disposed between rows formed by the blue sub-pixels along a second direction perpendicular to the first direction in one row.

The red sub-pixels and the green sub-pixels may be alternately disposed one by one.

The red sub-pixels and the green sub-pixels may be alternately disposed two by two.

The red sub-pixels may have a triangular shape having a side which faces a first side of the quadrangular shape and a side which is parallel to the first direction and the green sub-pixels may have a triangular shape having a side which faces a second side adjacent to the first side and a side which is parallel to the first direction.

The red sub-pixels may be disposed in a first column between two columns and the green sub-pixels may be disposed in a second column between two columns.

In the first column and the second column of the two columns, the red sub-pixels and the green sub-pixels may be alternately disposed in the first direction one by one and in the first column and the second column, sub-pixels having different colors may be disposed in a second direction perpendicular to the first direction.

In the first column and the second column of the two columns, the red sub-pixels and the green sub-pixels may be alternately disposed in the first direction one by one and in the first column and the second column, sub-pixels having the same color may be disposed in a second direction perpendicular to the first direction.

The red sub-pixels and the green sub-pixels may be disposed on both sides of a column formed by the blue sub-pixel, two columns of the red sub-pixels may be disposed on one side of the column formed by the blue sub-pixel in the first direction and two columns of the green sub-pixels may be disposed on the other side of the column formed by the blue sub-pixels in the first direction.

A distance between the blue sub-pixels and the red sub-pixels or the green sub-pixels may be smaller than a distance between the red sub-pixels and the green sub-pixels.

A size of the blue sub-pixel may be larger than a size of the green sub-pixel and the size of the green sub-pixel is larger than a size of the red sub-pixel.

According to another aspect of the present disclosure, an organic light emitting display device includes a plurality of unit pixels. The unit pixels may include one or more red sub-pixels, one or more green sub-pixels, and one or more blue sub-pixels, the blue sub-pixels included in adjacent pixels in a first direction may be located on the same line, one column of the red sub-pixels and one column of the green sub-pixels may be disposed between both sides of a column formed by the blue sub-pixels in the first direction, the blue sub-pixel, the red sub-pixel, and the green sub-pixel may have a quadrangular shape and one of diagonal lines of the quadrangular shape may be parallel to the first direction, and the red sub-pixels and the green sub-pixels may be disposed to be spaced apart from two adjacent sides of the quadrangular shape formed by the blue sub-pixels by a predetermined distance.

The blue sub-pixels, the red sub-pixels and the green sub-pixels may be repeatedly disposed on the same line in the second direction perpendicular to the first direction in accordance with a predetermined order.

The red sub-pixels and the green sub-pixels may be disposed between columns formed by the blue sub-pixels in the first direction in two columns.

The green sub-pixels may be disposed in a first column between two columns and the red sub-pixels are disposed in a second column between two columns.

It will be appreciated that technical spirit of the present disclosure have been described herein for purposes of illustration by the above description and the accompanying drawings, and that combination, separation, substitution, and modifications of components may be made by those skilled in the art without departing from the scope and spirit of the present disclosure. Therefore, the exemplary embodiments of the present disclosure are provided for illustrative purposes only but not intended to limit the technical spirit of the present disclosure. The scope of the technical spirit of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display device, comprising:
a plurality of unit pixels formed adjacent to overlap locations of a respective gate line and a respective data line of the organic light emitting display device, each of the unit pixels including one or more red sub-pixels, one or more green sub-pixels, and one or more blue sub-pixels,
the blue sub-pixels of adjacent unit pixels in a first direction are located in a first row in the first direction parallel to the gate line,
each of the red sub-pixels and the green sub-pixels in the unit pixels are disposed between each of the blue sub-pixels in a second row line extending in the first direction,
the blue sub-pixels having a quadrangular shape and
the red sub-pixels and the green sub-pixels having a triangular shape,
wherein a plurality of data lines are provided to each unit pixel and the data lines configured to supply data voltages to each of plurality of sub-pixels within each unit pixel, each data line corresponding to a sub-pixel of a specific color, and
wherein each respective data line is positioned to only pass a sub-pixel area of that same specific color for which the data line is providing data.

2. The organic light emitting display device according to claim 1, wherein the red sub-pixels and the green sub-pixels are disposed between rows formed by the blue sub-pixels along a second direction perpendicular to the first direction.

3. The organic light emitting display device according to claim 2, wherein the red sub-pixels are aligned in a first column in the second direction and the green sub-pixels are aligned in a second column in the second direction, the red sub-pixels and the green sub-pixels are alternately disposed one by one along the first direction parallel to the gate line.

4. The organic light emitting display device according to claim 2, wherein the red sub-pixels are aligned in a first column in the second direction and the green sub-pixels are aligned in a second column in the second direction, the red sub-pixels and the green sub-pixels are alternately disposed two by two along the second direction parallel to the gate line.

5. The organic light emitting display device according to claim 1, wherein the red sub-pixels have a side that faces a first side of the quadrangular blue sub-pixel, and another side that is parallel to the first direction, and
the green sub-pixels have a side that faces a second side of the blue sub-pixel adjacent to the first side, and another side that is parallel to the first direction.

6. The organic light emitting display device according to claim 1, wherein two columns of the red sub-pixels and the green sub-pixels are disposed between successive columns formed by the blue sub-pixels in the first direction, the red sub-pixels are disposed in a first column between the successive columns of the blue sub-pixels, and the green sub-pixels are disposed in a second column between the successive columns of the blue sub-pixels.

7. The organic light emitting display device according to claim 1, wherein two columns of the red sub-pixels and the green sub-pixels are disposed between successive columns formed by the blue sub-pixels in the first direction, wherein in a first column and a second column of the two columns of the red sub-pixels and the green sub-pixels, the red sub-pixels and the green sub-pixels are alternately disposed in the first direction one by one, and in the first column and the second column, sub-pixels having the same color are disposed in a second direction perpendicular to the first direction.

8. The organic light emitting display device according to claim 1, wherein the red sub-pixels and the green sub-pixels are disposed on both sides of a column formed by the blue sub-pixels, two columns of the red sub-pixels are disposed on one side of the column formed by the blue sub-pixels in the first direction and two columns of the green sub-pixels are disposed on the other side of the column formed by the blue sub-pixels in the first direction.

9. The organic light emitting display device according to claim 1, wherein a distance between the blue sub-pixels and at least one of an adjacent red sub-pixel and an adjacent green sub-pixel of a same unit pixel is smaller than a distance between the red sub-pixel and the green sub-pixel of the unit pixel.

10. An organic light emitting display device, comprising: a plurality of unit pixels, each of the unit pixels including one or more red sub-pixels, one or more green sub-pixels, and one or more blue sub-pixels,
- the blue sub-pixels of adjacent unit pixels in a first direction are located along a same line in the first direction,
- two columns of the red sub-pixels and the green sub-pixels in the unit pixels are disposed between successive columns formed by the blue sub-pixels in the first direction,
- the blue sub-pixels having a quadrangular shape and a diagonal line of the quadrangular shape is disposed to be parallel to the first direction, and
- the red sub-pixels and the green sub-pixels having a triangular shape are disposed to be spaced apart from respective adjacent sides of the quadrangular blue sub-pixels by a predetermined distance,
- wherein an area of the blue sub-pixels is larger than an area of the green sub-pixels, and the area of the green sub-pixels is larger than an area of the red sub-pixels.

11. An organic light emitting display device, comprising: a plurality of unit pixels, each of the unit pixels including one or more red sub-pixels, one or more green sub-pixels, and one or more blue sub-pixels,
- the blue sub-pixels of adjacent pixels in a first direction are located on a same line,
- one column of the red sub-pixels and one column of the green sub-pixels are disposed along opposite sides of a column formed by the blue sub-pixels in the first direction,
- the blue sub-pixels, the red sub-pixels, and the green sub-pixels have quadrangular shapes, each of the quadrangular shapes having a diagonal line oriented parallel to the first direction, and
- the red sub-pixels and the green sub-pixels are spaced apart from respective adjacent sides of the blue sub-pixels by a predetermined distance,
- wherein an area of the blue sub-pixels is larger than an area of the green sub-pixels, and the area of the green sub-pixels is larger than an area of the red sub-pixels.

12. The organic light emitting display device according to claim 11, wherein the blue sub-pixels, the red sub-pixels and the green sub-pixels are repeatedly disposed on the same line in the second direction perpendicular to the first direction in accordance with a predetermined order.

13. The organic light emitting display device according to claim 11, wherein the red sub-pixels and the green sub-pixels are disposed in two columns between respective columns formed by the blue sub-pixels in the first direction.

14. The organic light emitting display device according to claim 13, wherein the green sub-pixels are disposed in a first column of the two columns and the red sub-pixels are disposed in a second column of the two columns.

15. An organic light emitting display device, comprising:
- a first unit pixel, the first unit pixel including a first red sub-pixel, a first green sub-pixel, and a first blue sub-pixel; and
- a second unit pixel adjacent to the first unit pixel in a row direction, the second unit pixel including a second red sub-pixel, a second green sub-pixel, and a second blue sub-pixel,
- wherein the first and the second green sub-pixels are adjacent to one another in the row direction to virtually form a larger green pixel,
- wherein an area of the blue sub-pixel in a unit pixel is larger than an area of the green sub-pixel in the unit pixel, and the area of the green sub-pixel in the unit pixel is larger than an area of the red sub-pixel in the unit pixel.

16. The organic light emitting display device of claim 15, further comprising:
- a third unit pixel adjacent to the first unit pixel in a column direction, the third unit pixel including a third red sub-pixel, a third green sub-pixel, and a third blue sub-pixel; and
- a fourth unit pixel adjacent to the third unit pixel in the row direction, the fourth unit pixel including a fourth red sub-pixel, a fourth green sub-pixel, and a fourth blue sub-pixel,
- wherein the third and fourth green sub-pixels are adjacent to one another in the row direction to virtually form a larger green pixel.

17. An organic light emitting display device, comprising:
- a plurality of unit pixels formed adjacent to overlap locations of a respective gate line and a respective date line of the organic light emitting display device, the plurality of unit pixels including a first unit pixel and a second unit pixel,
- the first unit pixel including a first red sub-pixel, a first green sub-pixel, and a first blue sub-pixel; and
- the second unit pixel adjacent to the first unit pixel in a first direction are located in a first row in the first direction parallel to the gate line, the second unit pixel including a second red sub-pixel, a second green sub-pixel, and a second blue sub-pixel,
- wherein the first red sub-pixel and the second red sub-pixel are adjacent to one another in the first row in the first direction to virtually form a larger red pixel,
- wherein each data line corresponds to a sub-pixel of a specific color, the data lines only passing a sub-pixel area of that same specific color.

* * * * *